(12) United States Patent
Wirth et al.

(10) Patent No.: US 7,337,663 B2
(45) Date of Patent: Mar. 4, 2008

(54) SONIC ENERGY PROCESS CHAMBER

(75) Inventors: Paul Z. Wirth, Columbia Falls, MT (US); Dana R. Scranton, Kalispell, MT (US); Brian Aegerter, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 219 days.

(21) Appl. No.: 11/078,997

(22) Filed: Mar. 11, 2005

(65) Prior Publication Data

US 2005/0199066 A1    Sep. 15, 2005

Related U.S. Application Data

(60) Provisional application No. 60/552,987, filed on Mar. 12, 2004.

(51) Int. Cl.
    *B08B 3/12* (2006.01)
(52) U.S. Cl. .................. 73/432.1; 134/1.3; 134/902
(58) Field of Classification Search .................. None
    See application file for complete search history.

(56) References Cited

U.S. PATENT DOCUMENTS

| | | | |
|---|---|---|---|
| 5,279,316 A * | 1/1994 | Miranda | .................. 134/102.1 |
| 5,911,837 A | 6/1999 | Matthews | |
| 6,202,658 B1 * | 3/2001 | Fishkin et al. | .............. 134/147 |
| 6,311,702 B1 * | 11/2001 | Fishkin | ...................... 134/1.3 |
| 6,357,142 B1 | 3/2002 | Bergman | |
| 6,492,284 B2 | 12/2002 | Peace et al. | |
| 6,502,591 B1 | 1/2003 | Scranton et al. | |
| 6,511,914 B2 | 1/2003 | Wirth et al. | |
| 6,537,482 B1 * | 3/2003 | Farnworth | .................. 264/482 |
| 6,754,980 B2 | 6/2004 | Lauerhaas et al. | |
| 6,774,056 B2 | 8/2004 | Kuntz et al. | |
| 6,875,284 B2 | 4/2005 | Scranton | |
| 2002/0066464 A1 | 6/2002 | Bergman | |
| 2002/0139390 A1 * | 10/2002 | Okano et al. | ................. 134/1.3 |
| 2002/0157686 A1 | 10/2002 | Kenny et al. | |
| 2004/0245094 A1 * | 12/2004 | McHugh et al. | ............ 204/253 |

\* cited by examiner

*Primary Examiner*—Hezron Williams
*Assistant Examiner*—Rose M Miller
(74) *Attorney, Agent, or Firm*—Perkins Coie LLP

(57) ABSTRACT

A system for processing a workpiece includes a base having a bowl or recess for holding a processing fluid. A sonic energy source, such as a megasonic transducer, provides sonic energy into a processing fluid in the bowl. A process head holds a workpiece. A process head lifter lowers the head holding the workpiece into the processing fluid in the bowl. Sonic energy is provided to the workpiece through the processing fluid, optionally while the processing head spins the workpiece. The processing fluid may include de-ionized water and an etchant.

24 Claims, 12 Drawing Sheets

SONIC ENERGY PROCESS CHAMBER

CROSS-REFERENCE TO RELATED APPLICATIONS

This application claims priority from provisional U.S. Patent Application No. 60/552,987, filed Mar. 12, 2004. Priority to this application is claimed under 35 U.S.C. § 119, and the disclosure of this application is incorporated herein by reference in its entirety.

TECHNICAL FIELD

The invention relates to surface preparation, cleaning, rinsing and drying of workpieces, such as semiconductor wafers, flat panel displays, rigid disk or optical media, thin film heads or other workpieces formed from a substrate on which microelectronic circuits, data storage elements or layers, or micro-mechanical elements may be formed. These and similar articles are collectively referred to herein as a "wafer" or "workpiece." Specifically, the present invention relates to a sonic energy process chamber and the use of sonic energy to treat semiconductor workpieces.

BACKGROUND OF THE INVENTION

The semiconductor manufacturing industry is constantly seeking to improve the processes used to manufacture microelectronic circuits and components, such as the manufacture of integrated circuits from wafers. The objectives of many of these improved processes are decreasing the amount of time required to process a wafer to form the desired integrated circuits; increasing the yield of usable integrated circuits per wafer by, for example, decreasing contamination of the wafer during processing; reducing the number of steps required to create the desired integrated circuits; improving the uniformity and efficiency of processes used to create the desired integrated circuits; and reducing the costs of manufacture.

In the processing of wafers, it is often necessary to subject one or more sides of the wafer to a fluid in liquid, vapor or gaseous form. Such fluids are used to, for example, etch the wafer surface, clean the wafer surface, dry the wafer surface, passivate the wafer surface, deposit films on the wafer surface, etc. Controlling how the processing fluids are applied to the wafer surfaces is often important to the success of the processing operations.

Various machines and methods have been used for carrying out these manufacturing processes. However, existing machines have several disadvantages. These disadvantages include relatively large consumption of process chemicals and water. This consumption of process chemicals increases manufacturing costs, which ultimately increases the cost of the final product, such as e.g., computers, cell phones, and virtually all types of consumer, industrial, commercial and military electronic products. In addition, many process chemicals are toxic and require special handling, storage, and disposal methods. These can be costly and difficult, but are necessary for health, safety and environmental reasons. Consequently, reducing consumption of process chemicals has many advantages.

In many process manufacturing steps, the process chemicals used should be applied evenly onto the wafers to avoid having too much or too little etching, film removal, etc. Existing machines often are not able to sufficiently uniformly apply process chemicals. This can result in lower yields. Moreover, many existing machines try to compensate for variations in applying process chemicals by using larger amounts of process chemicals. This inefficient use of process chemicals leads to the disadvantages described above. Accordingly, improved machines and methods which provide improved yield, consume less process chemicals and water, and offer better results in performing manufacturing operations, are needed.

Manufacturing semiconductor and similar products on a commercial scale requires a fab or manufacturing facility often costing hundreds of million dollars to build and equip. Operating and maintenance costs are also very high. Consequently, the output or yield of the fab is critical to successful operations. Faster processing can help increase the fab output. While conventional processing with liquids may produce the desired results, it can be time consuming. Accordingly, faster process methods and machines are very advantageous.

In the past, the use of sonic energy to expedite and provide more efficient processing of semiconductor products has been explored. For example, U.S. Pat. Nos. 6,492,284 and 6,511,914 disclose reactors for processing semiconductor wafers using sonic energy. The use of sonic energy in process fluids creates cavitation, i.e., the formation of partial vacuums in the process fluid. Cavitation dislodges particles and cleans the crevices created by microelectronics formed on the workpiece surface. The required concentration of the processing fluid, e.g., hydrofluoric acid, can be greatly reduced by using higher levels of sonic energy in a semiconductor surface treatment process. Further, the higher the level of sonic energy used, the greater likelihood there is of dislodging particles and impurities that could get lodged in the minute crevices created by the microelectronics formed on the wafer surface. By using more sonic energy, a more uniform and efficient process treatment can be accomplished across substantially the entire surface of the wafer being treated. Too much sonic energy, however, and the microelectronics, the wafer itself, and any dielectric on the wafer surface could be destroyed. Thus, a problem exists in the semiconductor processing industry of balancing the benefits of using sonic energy, without damaging the wafers and microelectronics.

The sonic energy sources disclosed in U.S. Pat. Nos. 6,492,284 and 6,511,914 provide a localized, highly concentrated sonic energy. The sonic energy sources disclosed in U.S. Pat. Nos. 6,492,284 and 6,511,914 do not have a total surface area corresponding to at least 25% of the total surface area of the workpiece being treated. As a result, it is difficult to achieve a uniform process treatment across the entire surface of the wafer. Moreover, the configuration of the sonic energy sources disclosed in U.S. Pat. Nos. 6,492,284 and 6,511,914: (1) create a dampening effect by trapping the sonic energy between the source and the wafer, reducing the effectiveness of the sonic energy; and (2) make it difficult to adequately drain chemistry or liquid from the bowl. The present invention is an improvement over the reactors disclosed in U.S. Pat. Nos. 6,492,284 and 6,511,914 and provide for the benefits associated with the use of sonic energy for treating semiconductor wafers, without otherwise damaging or destroying the wafer and microstructures created thereon.

SUMMARY OF THE INVENTION

A semiconductor processing chamber and methods in treating workpieces have been invented that provide a uniform distribution of sonic energy to achieve a uniform process treatment across substantially the entire wafer surface being treated. Specifically, after much research and development, it has been determined that by providing a sonic energy source with a large enough total surface area relative to the surface area of the workpiece to be treated, one can sufficiently reduce the boundary layer thickness between the workpiece and the processing fluid to provide a more uniform and efficient treatment across substantially the entire surface of the workpiece being treated.

The present invention also reduces the dampening effect present in prior process chambers and improves liquid flow in the process chamber to expedite processing and provide more efficient overall processing. Particularly, it has been determined that by positioning the workpiece at an angle to the sonic energy source, the sonic energy is provided with a natural outlet or flow path. That is, instead of continuing to reverberate off the workpiece and the sonic energy source, sonic energy introduced into the fluid will eventually be channeled out from between the source and the workpiece, reducing interference and lessening any dampening effect. As a result, the efficiency of the process is greatly enhanced. Moreover, an angled sonic energy source improves fluid flow distribution across the workpiece surface and improves the ability to quickly and adequately drain fluid from the process chamber.

Accordingly, the sonic energy process chamber of the present invention provides remarkably improved semiconductor manufacturing processes that result in more consistent, uniform microelectronic devices, better manufacturing yields and lower manufacturing costs.

In one embodiment of the present invention, a workpiece processor includes a bowl, a full-faced, sonic energy source, and a process head. Processing fluids are introduced into the bowl and distributed across the surface of the workpiece in the processor. The full-faced, sonic energy source is positioned within the bowl and introduces sonic energy into the processing fluid. A process head holds the workpiece and lowers the workpiece into the processing fluid for treatment.

In another embodiment of the present invention, a workpiece processor includes a bowl, a sonic-energy source and a process head. Processing fluids are introduced into the bowl and distributed across the surface of the workpiece in the processor. The sonic energy source is positioned within the bowl and introduces sonic energy into the processing fluid. A process head holds the workpiece and lowers the workpiece into the processing fluid for treatment. The sonic energy source has a total surface area that is large enough relative to the surface area of the workpiece to be treated such that the boundary layer between the processing fluid and the workpiece is sufficiently reduced to provide a uniform process treatment across substantially the entire treated surface area of the workpiece.

In yet another embodiment of the present invention, a system for processing a workpiece is provided. The system includes a plurality of workpiece stations and a robot moveable between the workpiece stations for moving a workpiece from one station to another station. At least one workpiece station has a bowl, a full-faced, sonic energy source associated with the bowl, and a process head. The process head holds the workpiece and lowers into the bowl for processing. Processing fluids are introduced into the bowl. The sonic energy source introduces sonic energy into the fluid in the bowl for treating the workpiece.

In another embodiment of the invention, a workpiece processor includes a bowl for holding a liquid, a sonic energy source associated with the bowl for introducing sonic energy into the liquid in the bowl, and a process head for holding the workpiece and lowering the workpiece into the liquid in the bowl such that the sonic energy source and the workpiece form an angle, θ, greater than 0°. This can be accomplished in several manners. For example, the sonic energy source can be fixed within the bowl in a substantially horizontal plane. Upon lowering the workpiece into the processing fluid, the process head (holding the workpiece) pivots or rotates to create a desired angle between the workpiece and the sonic energy source. In another embodiment, the sonic energy source is fixed within the bowl at a slight angle to a horizontal plane and the workpiece is lowered into the processing fluid in a substantially horizontal plane. In yet another embodiment, the sonic energy source is pivotally positioned in the bowl, and can be pivoted from a substantially horizontal position to an angled position.

In another embodiment of the present invention, a system for processing a workpiece is provided. The system includes a plurality of workpiece stations and a robot moveable between the workpiece stations for moving a workpiece from one station to another station. At least one workpiece station has a bowl for holding a liquid, a sonic energy source associated with the bowl for introducing sonic energy into the liquid in the bowl, and a process head for holding the workpiece and lowering the workpiece into the liquid in the bowl such that the sonic energy source and the workpiece form an angle, θ, greater than 0°. The angle between the sonic energy source and the workpiece can be accomplished in the various manners described above.

In another embodiment of the present invention, the sonic energy supplied to the process chamber is monitored and controlled to prevent the sonic energy from destroying or damaging the workpiece.

DETAILED DESCRIPTION

Figure 1:
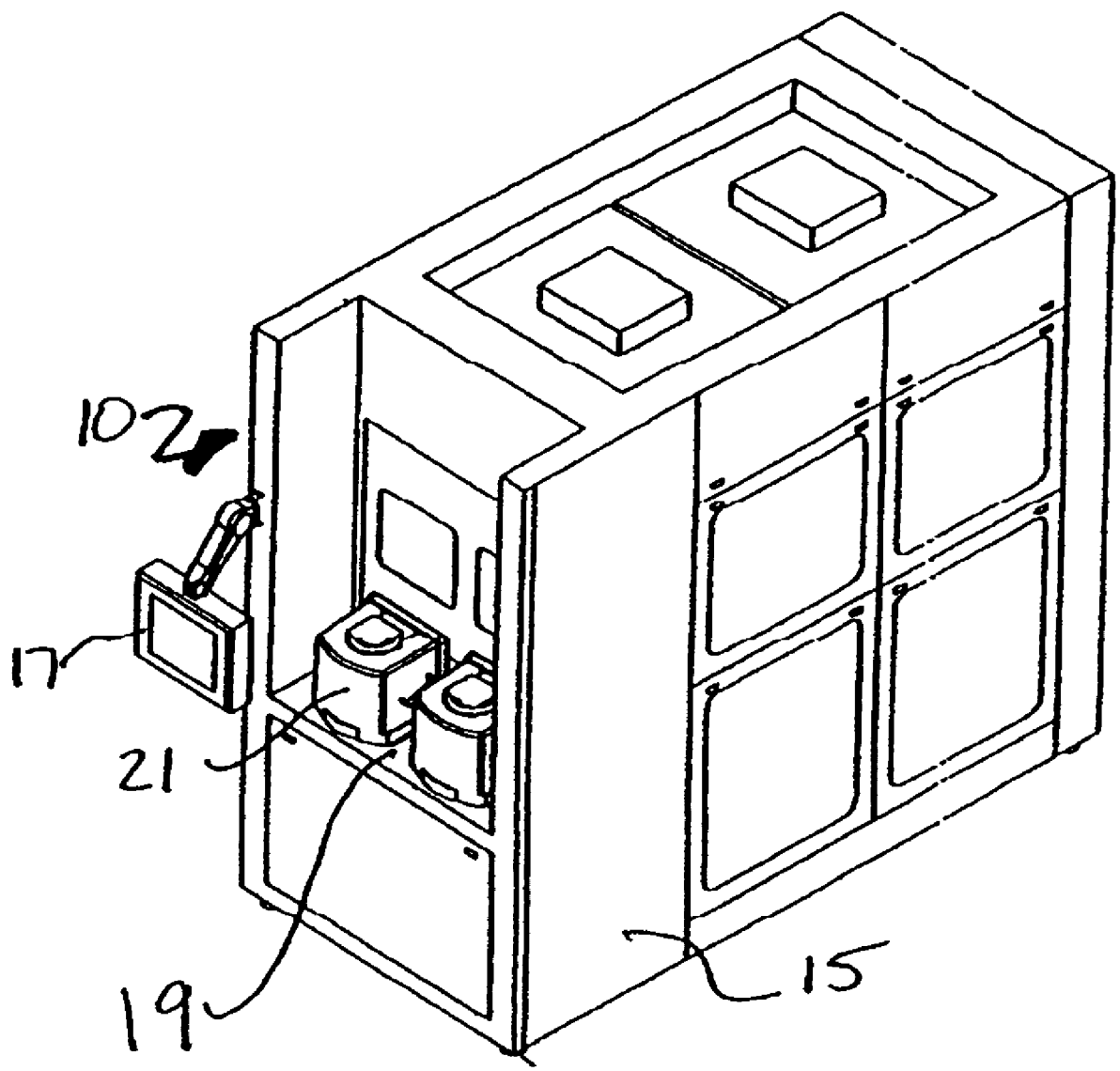
FIG. 1 is a perspective view of a workpiece processing system including a sonic energy workpiece process chamber according to the present invention.

As shown in FIG. 1, a processing system 10 has an enclosure 15, a control/display 17, and an input/output station 19. Wafers or workpieces 24 within pods or boxes 21 (e.g., FOUPs) are removed from the boxes 21 at the input/output station 19 and processed within the system 10.

Figure 2A:
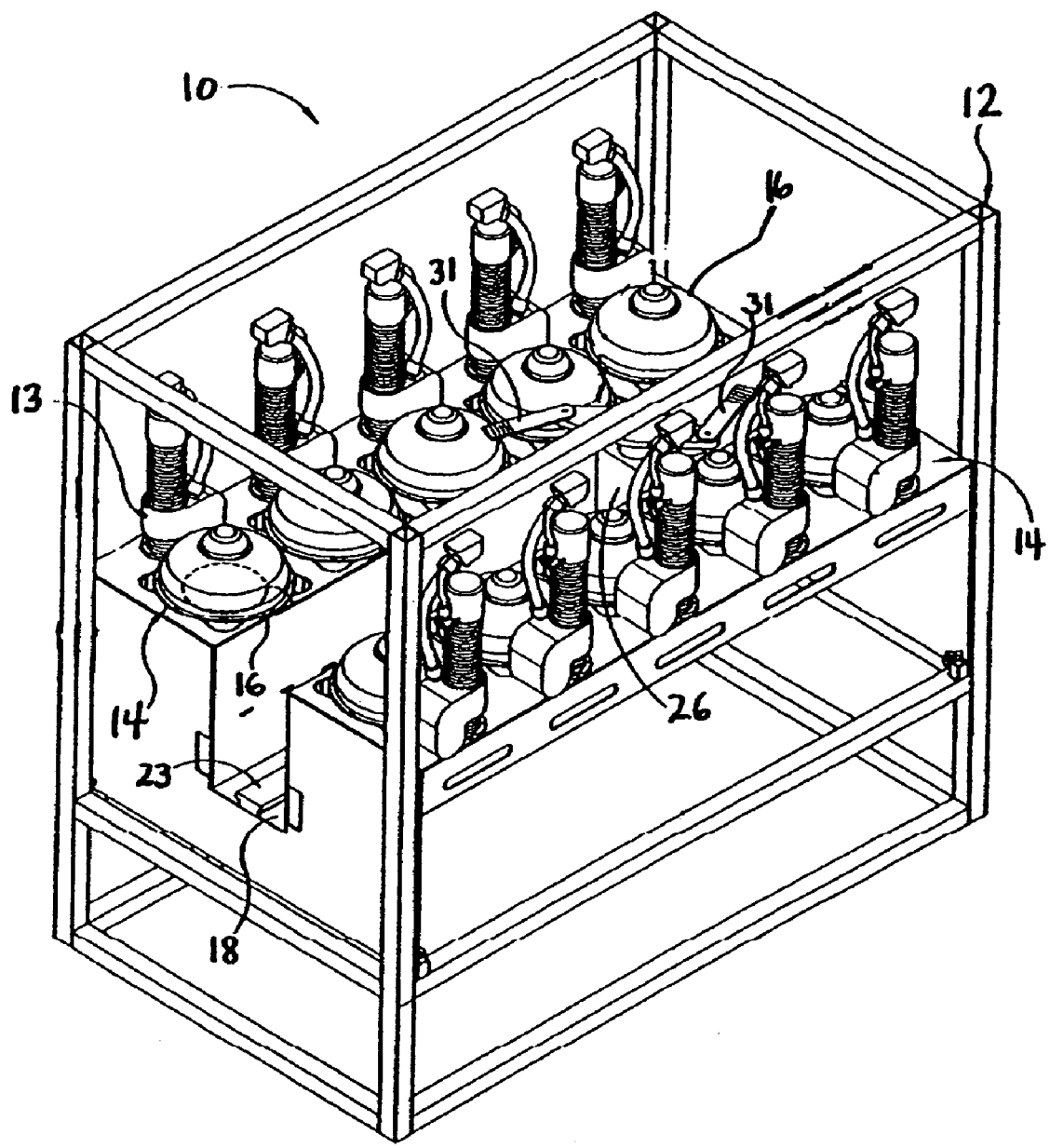
FIG. 2A is an isometric showing a portion of a workpiece processing system configured in accordance with an embodiment of the present invention.
Figure 2B:
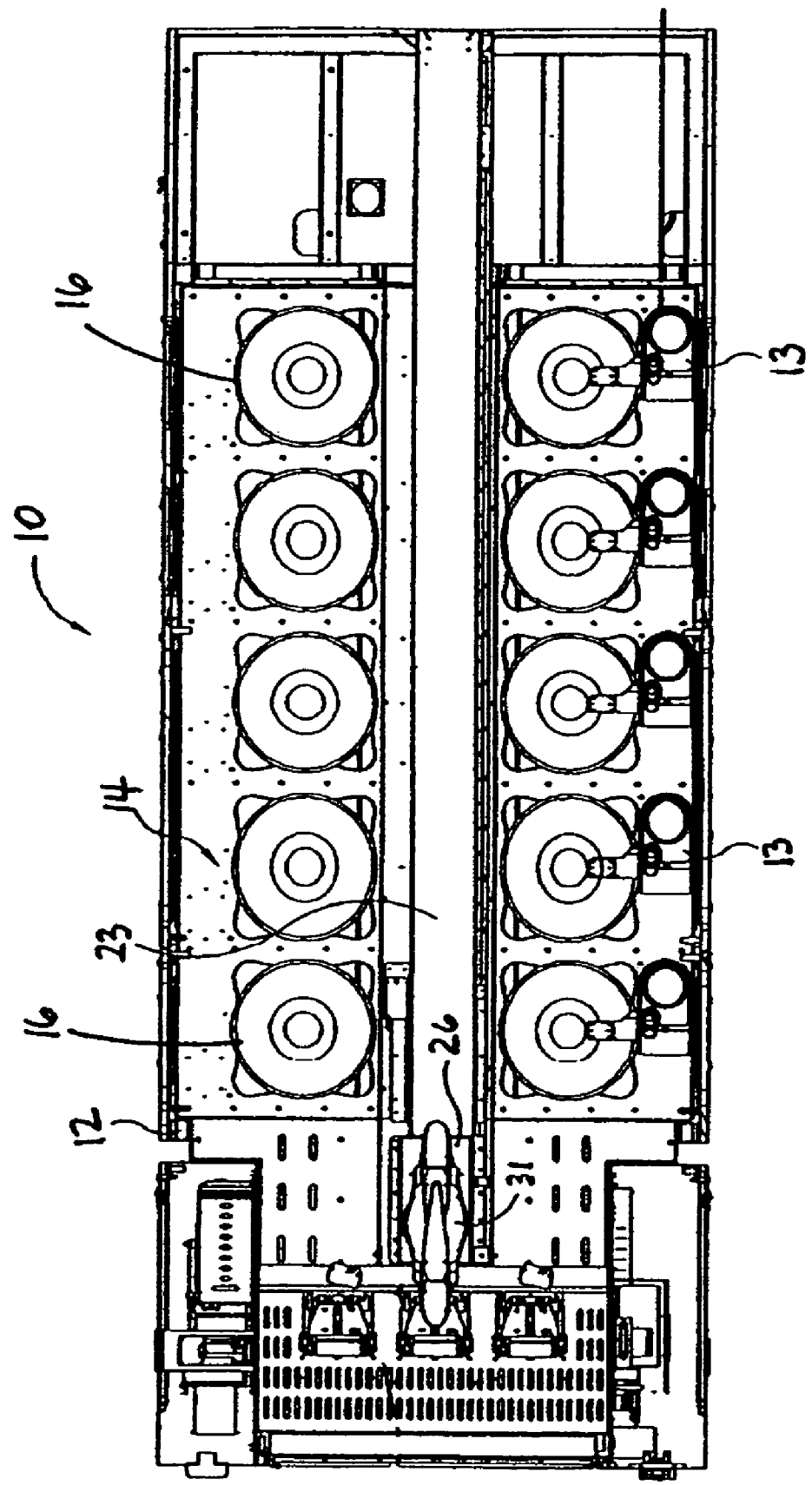
FIG. 2B is a top plan view of a workpiece processing system configured in accordance with an embodiment of the present invention, with components removed for purposes of illustration.

Turning to FIGS. 2A and 2B, the processing system 10 includes a support structure frame 12 with a plurality of processing stations 14 within the enclosure 15. A processing station 14 includes a process chamber 16 and a lift/rotate actuator 13. The process chamber 16 may be configured to process workpieces 24, such as 200 or 300 mm diameter semiconductor wafers provided within sealed boxes 21, open cassettes, or other carrier or container. The workpiece process chamber 16 of the present invention is designed to be utilized in a processing system 10, for example, as disclosed in pending U.S. patent application Ser. Nos. 10/733,807 filed Dec. 11, 2003 and Published as U.S. Appication Publication 2004/0245094, 10/859,748 filed Jun. 3, 2004 and Published as U.S. Application Publication 2005/0050767, 10/859,749 filed Jun. 3, 2004 and published as U.S. Application Publication 2005/0034977, 10/860,384 filed Jun. 3, 2004 and published as U.S. Application Publication 2005/0035046, 10/860,385 filed Jun. 3, 2004 and published as U.S. Application Publication 2005/0109088, 10/860,592 filed Jun. 3, 2004 and published as U.S. Application Publication 2005/0063798, 10/860,593 filed Jun. 3 2004 and published as U.S. Application Publication 2005/0061438, 10/861,240 filed Jun. 3, 2004, now U.S. Pat. No. 7,198,694, 10/691,688 filed Oct. 22, 2003 now U.S. Pat. 6,900,132 and 10/690,864 filed Oct. 21, 2003, now U.S. Pat. No. 6,930,046. These U.S. patent applications are fully incorporated herein by reference. The workpiece process chamber 16 is configured to perform a variety of functions including but not limited to electrochemical processing, electroless processing, etching and/or rinsing.

The system 10 in FIGS. 2A and 2B is shown having ten process stations 14, but any desired number of processing stations 14 may be included in the enclosure 15. The frame 12 preferably includes a centrally located, longitudinally oriented platform 18 between the processing stations 14. One or more robots 26 having one or more end-effectors 31 move within the enclosure 15 for delivering workpieces 24 to and from various processing stations 14, and to load and unload workpieces 24 into and out of the process chambers 16. In a preferred embodiment, the robot 26 moves linearly along a track 23 in the space 18.

Figure 3:
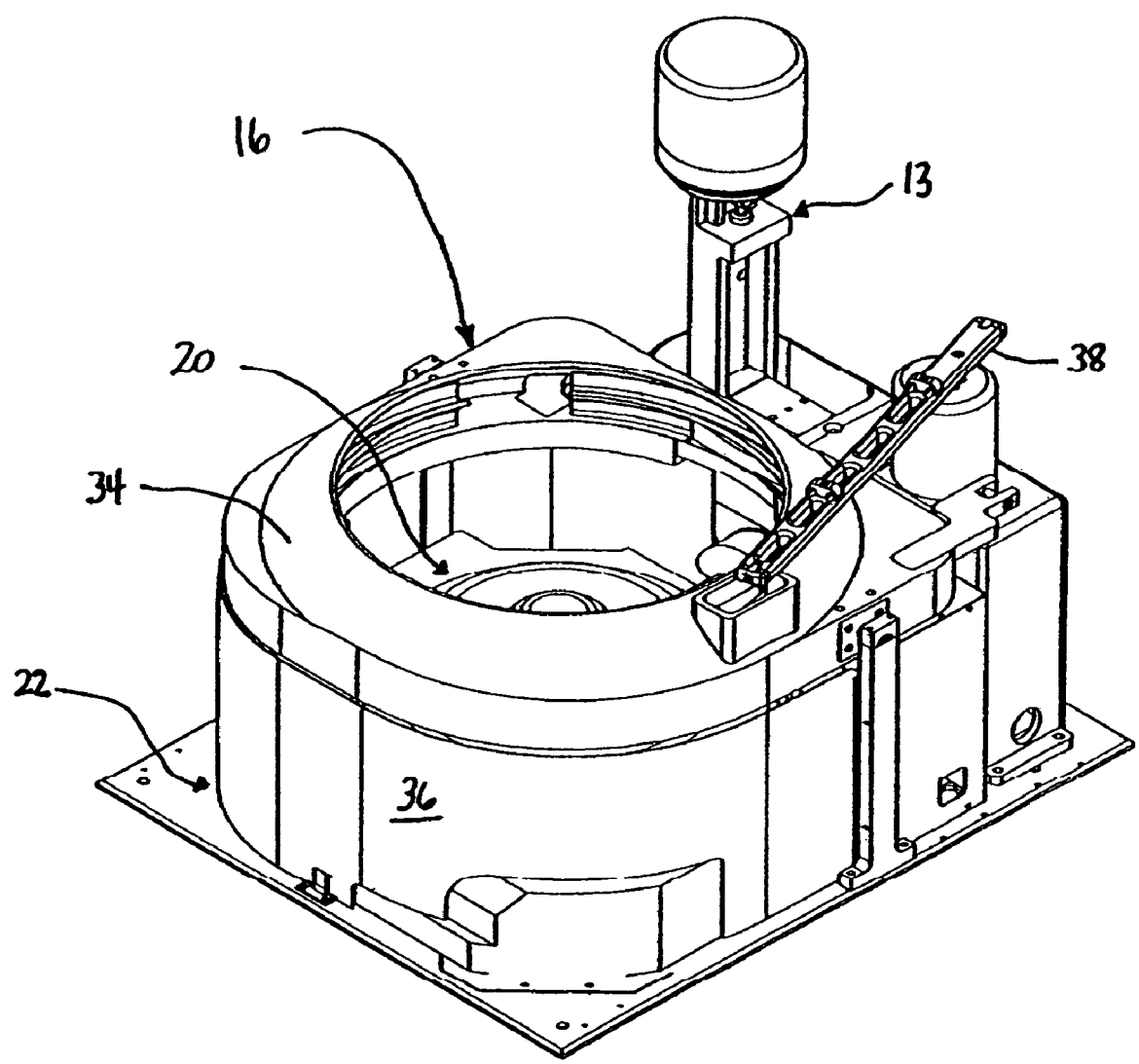
FIG. 3 is a perspective view of a sonic energy process chamber according to an embodiment of the present invention.
Figure 4:
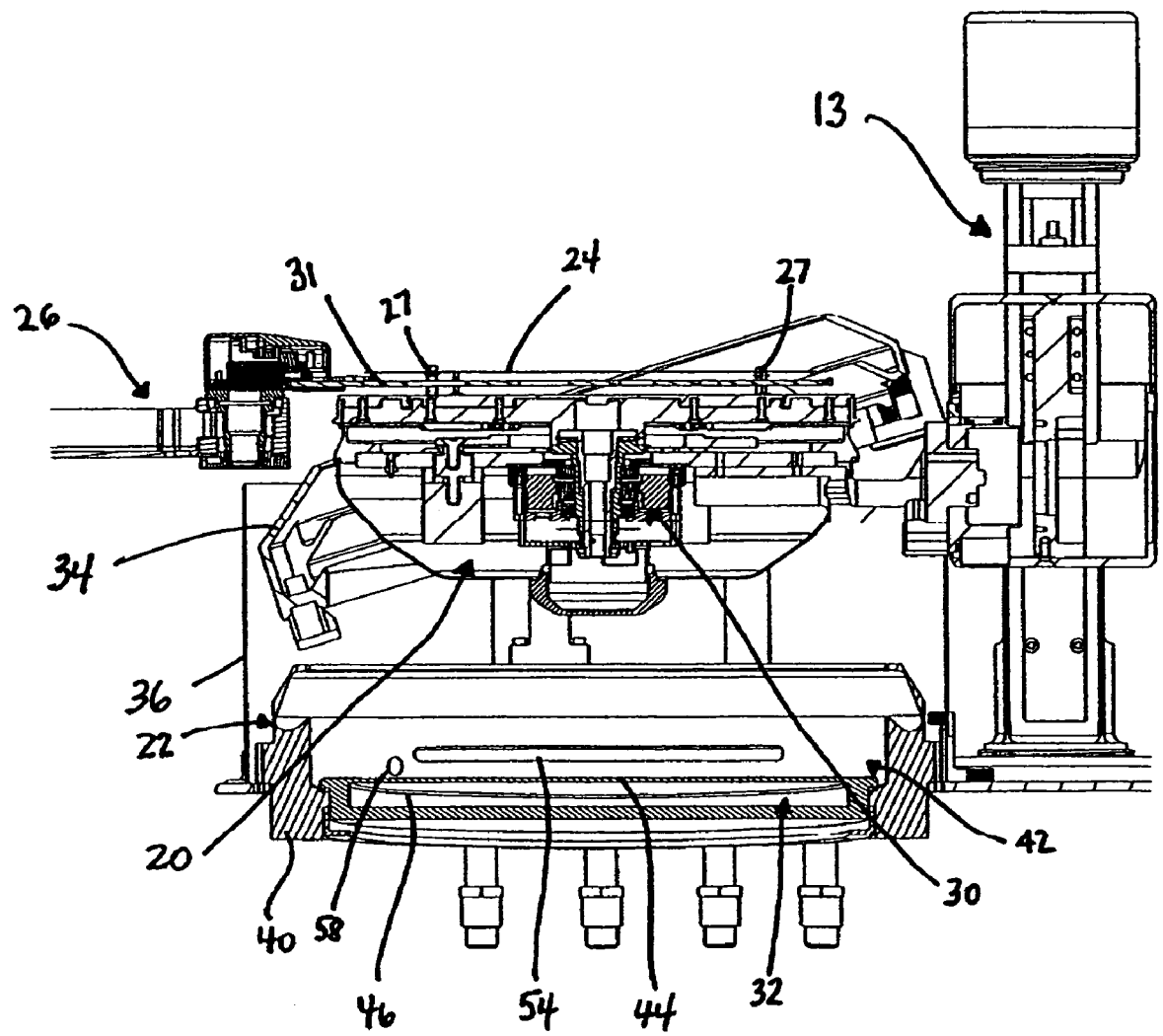
FIG. 4 is a cross-sectional view of the sonic energy process chamber shown in FIG. 3 in a loading position.
Figure 5:
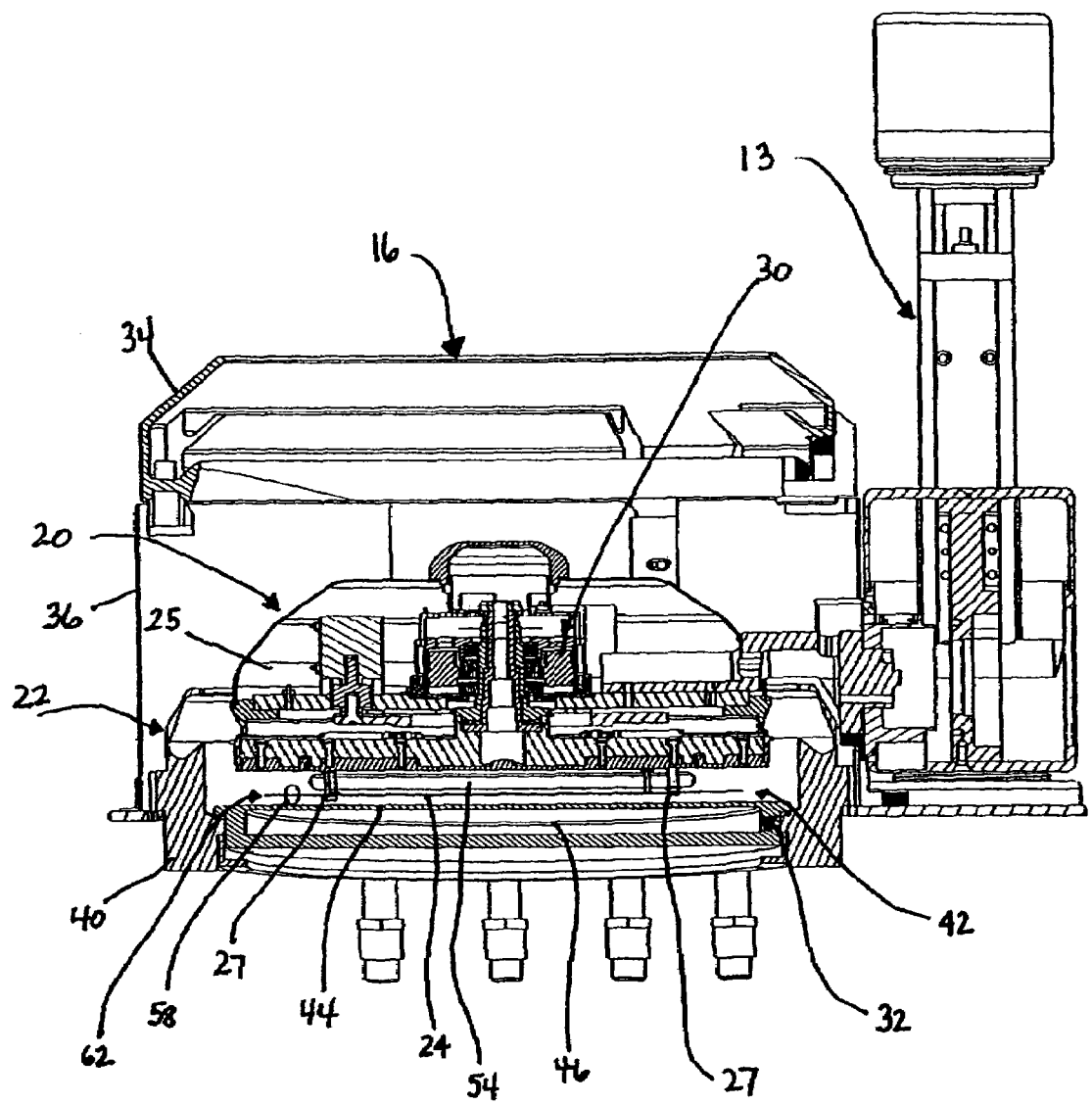
FIG. 5 is a cross-sectional view of the sonic energy process chamber shown in FIG. 3 in a first process position.

Referring to FIGS. 3-5, the workpiece process chamber 16 of the present invention utilizes sonic energy for the treatment of workpieces 24. The process chamber 16 includes a process head 20 and a base 22. In a preferred embodiment, the process head 20 has a rotor 25 with a plurality of fingers 27 to hold the workpiece 24. However, the present invention is designed to be utilized with a variety of process head 20 designs, including the process head 20 disclosed in U.S. Pat. No. 6,680,253 and U.S. Pat. No. 6,492,284, which are incorporated herein by reference. A motor 30 is connected to the rotor 25 and optionally can spin the rotor 25, and hence, the workpiece 24 during processing.

Referring specifically to FIG. 4, workpieces 24 can be loaded and unloaded into and out of the process head 20 by pivoting rim 34 away from a horizontal plane. In the loading position shown in FIG. 4, the process head 20 is open, i.e., face up. This permits the robot 26, and particularly end-effector 31, to load the workpiece 24 onto the process head 20. A plurality of fingers 27 attached to the process head 20 engage and hold the workpiece 24.

Figure 6:
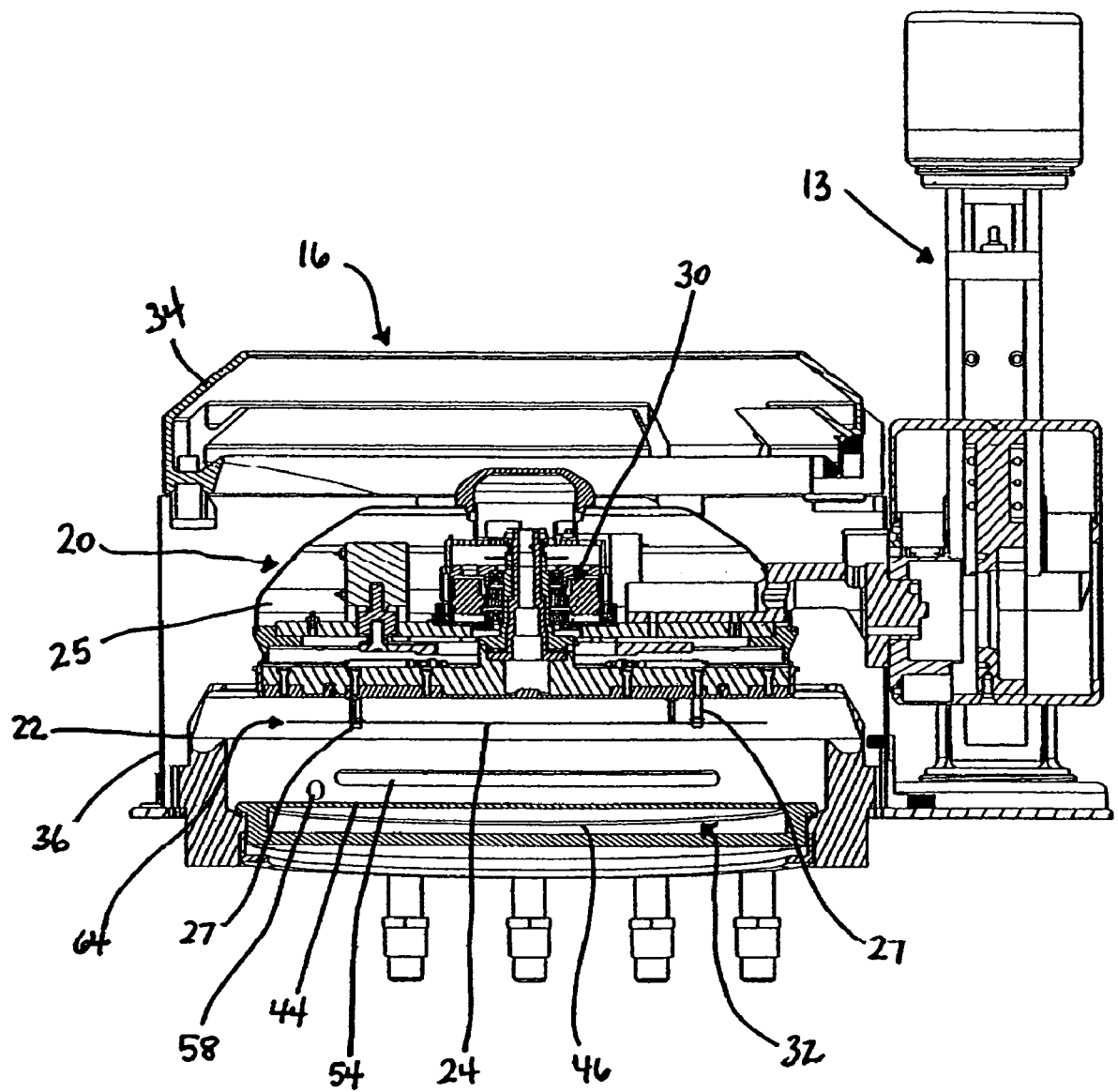
FIG. 6 is a cross-sectional view of the sonic energy process chamber shown in FIG. 3 in a second process position.

In a preferred embodiment shown in FIGS. 4-6, the lift/rotate actuator 13 rotates the process head 20 from the open or load position to a closed position, i.e., face down. The lift/rotate actuator 13 then lowers the process head 20 into a first process position in the process chamber 16 (FIG. 5). In this position, the base 22 includes a base plate 40. A sonic energy source 32, such as a sonic or megasonic transducer, is attached to or part of the base plate 40. The sonic transducer 32 is positioned within a central opening in the base plate 40 and forms the central bottom section of a bowl or liquid holding vessel 42. In a preferred embodiment, the sonic energy source 32 consists of a piezoelectric transducer having piezoelectric material solder bonded to a stainless steel core.

Figure 9:
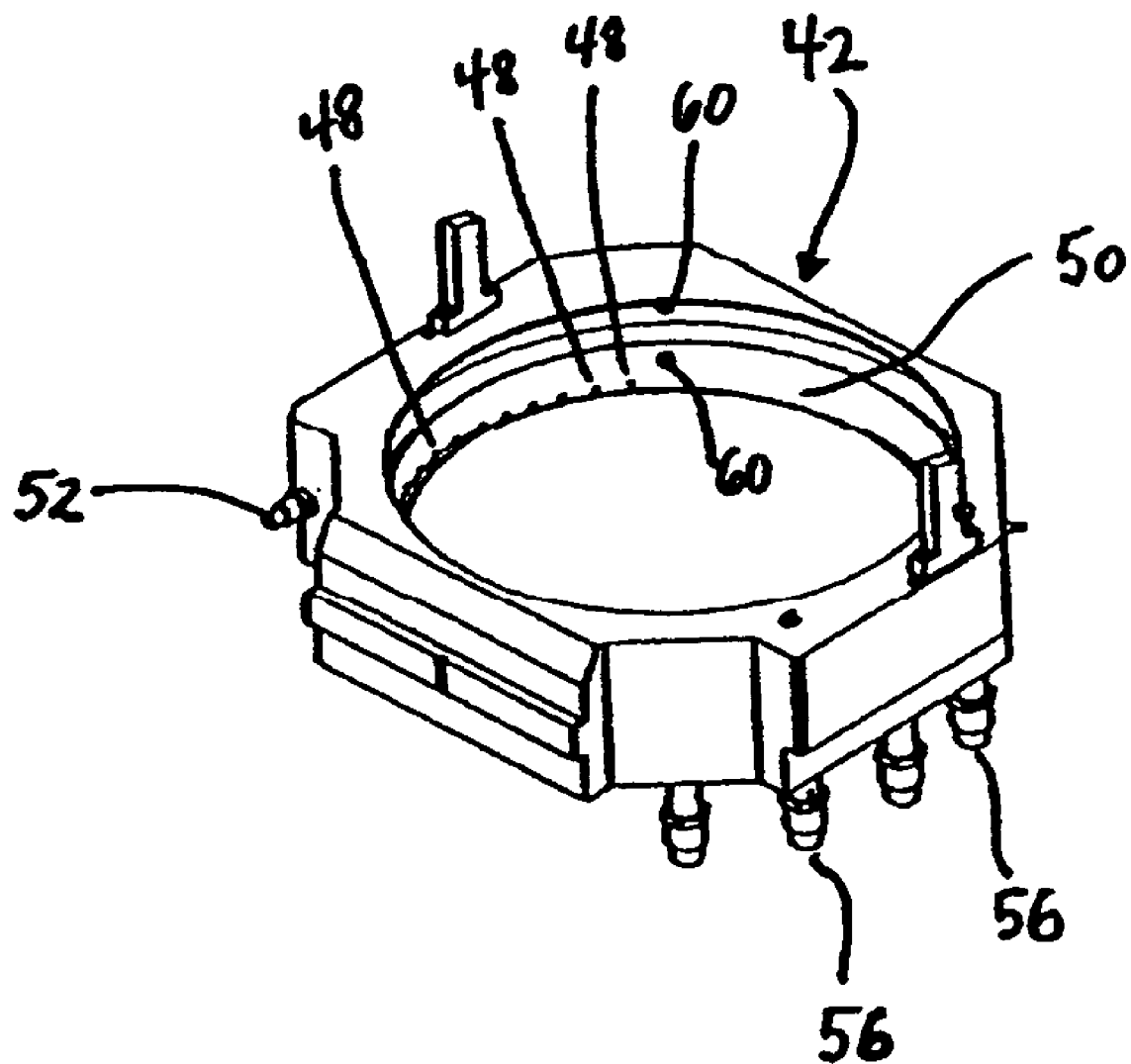
FIG. 9 is a perspective view of a process chamber bowl of the present invention.
Figure 10:
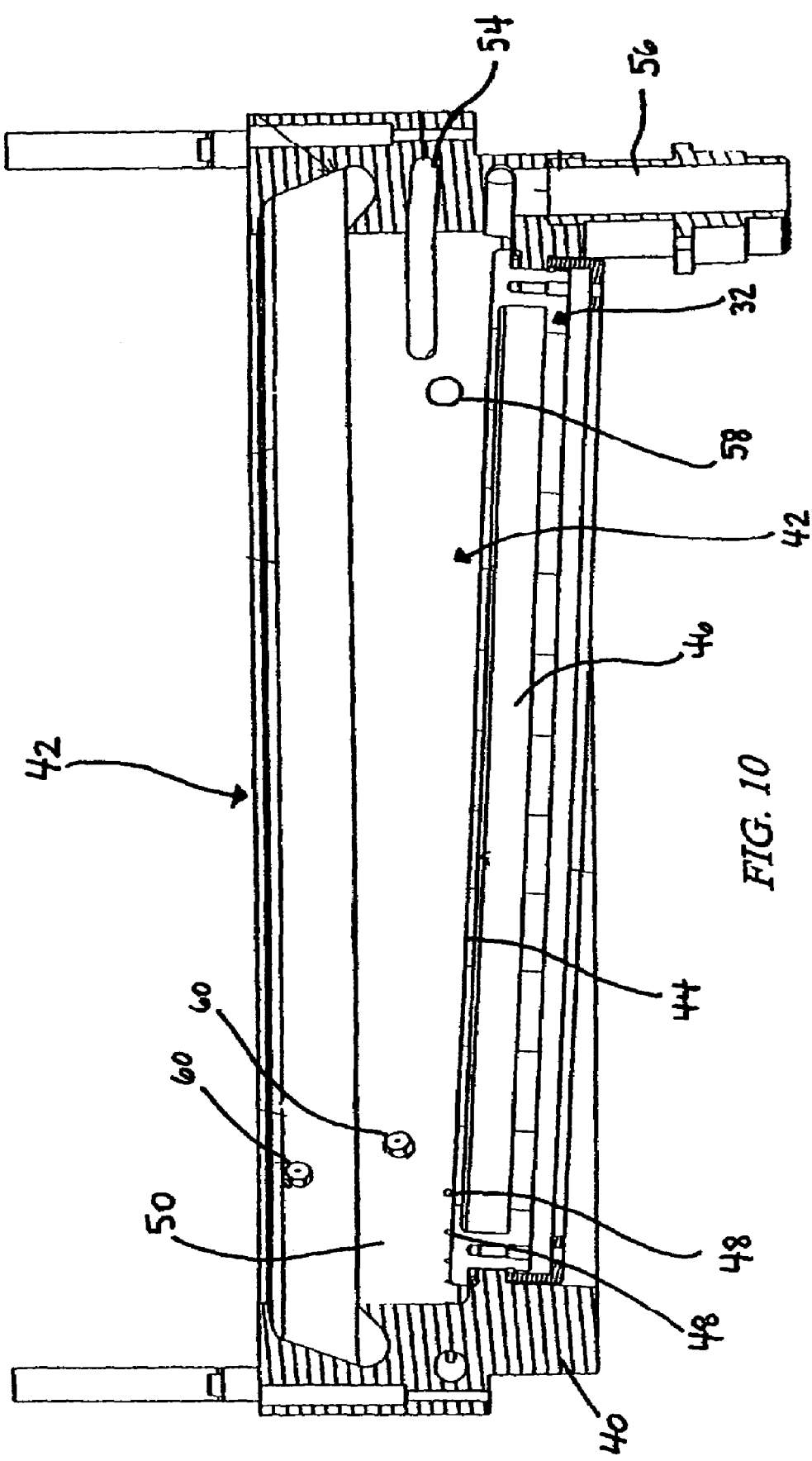
FIG. 10 is a cross-sectional view of the process chamber bowl shown in FIG. 9.

Turning to FIGS. 9 and 10, the bowl or liquid vessel 42 has a plurality of fluid entry ports 48 built into one end of a sidewall 50 of the bowl 42. The fluid entry ports can be connected to one or more processing fluid supply sources 52. Examples of processing fluids for use in the invention include: water, de-ionized water, ozonated water, hydrogen peroxide, hydrofluoric acid, sulfuric acid, ammonium hydroxide, ammonium fluoride, hydrochloric acid, phosphoric acid, nitric acid, acetic acid, potassium hydroxide, sodium hydroxide, and a combination thereof. A processing fluid exit port 54 is formed in the sidewall 50 of the bowl 42, opposite the fluid entry ports 48. This configuration promotes processing fluid flow across the workpiece 24 surface. In a preferred embodiment, the fluid exit port 54 takes the shape of an annular groove formed in the sidewall 50 of the bowl 42. The fluid exit port 54 in turn is connected to fluid drain 56 in the bottom of the bowl 42. In order to ensure that a safe level of processing fluid is maintained in the bowl 42, a fluid level sensor 58 is located in the bowl 42. At least one rinse nozzle 60 is connected to the bowl 42. In the preferred embodiment shown in FIG. 10, sensor 58 and two rinse nozzles 60 are built into the sidewall 50 of the bowl 42. The rinse nozzles 60 are positioned in the sidewall 50 and are used to spray liquid onto the backside or treatment side of the workpiece 24, for example, in a rinsing step, after the processing liquid has been drained from the bowl 42, or drained to a low enough level to expose the rinse nozzles 60. Preferably, the lift/rotate actuator 13 raises or lowers the process head 20, moving the workpiece 24 into a rinse position within the bowl 42. Accordingly, the bowl 42 has a first processing area or position 62, shown in FIG. 5, and a second processing area or position 64, shown in FIG. 6. It will be understood by those having skill in the art, that any conventional workpiece processing treatment may take place in either the first processing area or position 62, or the second processing area or position 64.

With the bowl 42 containing a processing fluid, the process head 20 introduces the workpiece into the fluid. A boundary layer is formed between the surface of the workpiece 42 being treated and the fluid. At this point, the sonic energy source 32 is energized. Sonic energy travels through the fluid to the workpiece 24 in contact with the fluid. Without limiting the present invention, it is believed that the sonic energy reduces the boundary layer thickness by refreshing the fluid near the treatment surface of the workpiece 24. Through much research, it has now been determined that the total surface area of the sonic energy source 32 has a substantial impact on: (1) reducing the boundary layer between the workpiece 24 and the process fluid; and (2) providing a uniform process treatment across the surface of the workpiece 24. Also, by sufficiently reducing the boundary layer thickness, a satisfactory surface treatment may be accomplished using process fluids having lower concentrations, which aid in the handling and disposal of such fluids.

Specifically, it has now been determined that by using a sonic energy source 32 having a total surface area of at least 25% of the total treatment surface area of the workpiece 24, a more dilute processing fluid concentration can be used and a substantially uniform process treatment can be achieved across the treatment surface of the workpiece 24. In a preferred embodiment, the total surface area of the sonic energy source 32 corresponding to the total surface area of the workpiece 24 being treated is at least 25%; in a more preferred embodiment between about 25% and about 50%; in an even more preferred embodiment between about 50% and 75%; and especially between about 75% and about 100%. In the most preferred embodiment, when the workpiece 24 is lowered into the bowl 42, the total working surface area of the sonic energy source 32 covers or corresponds to the entire workpiece 24 surface being treated (i.e., 100%) or more (i.e., greater than 100%).

Figure 7:
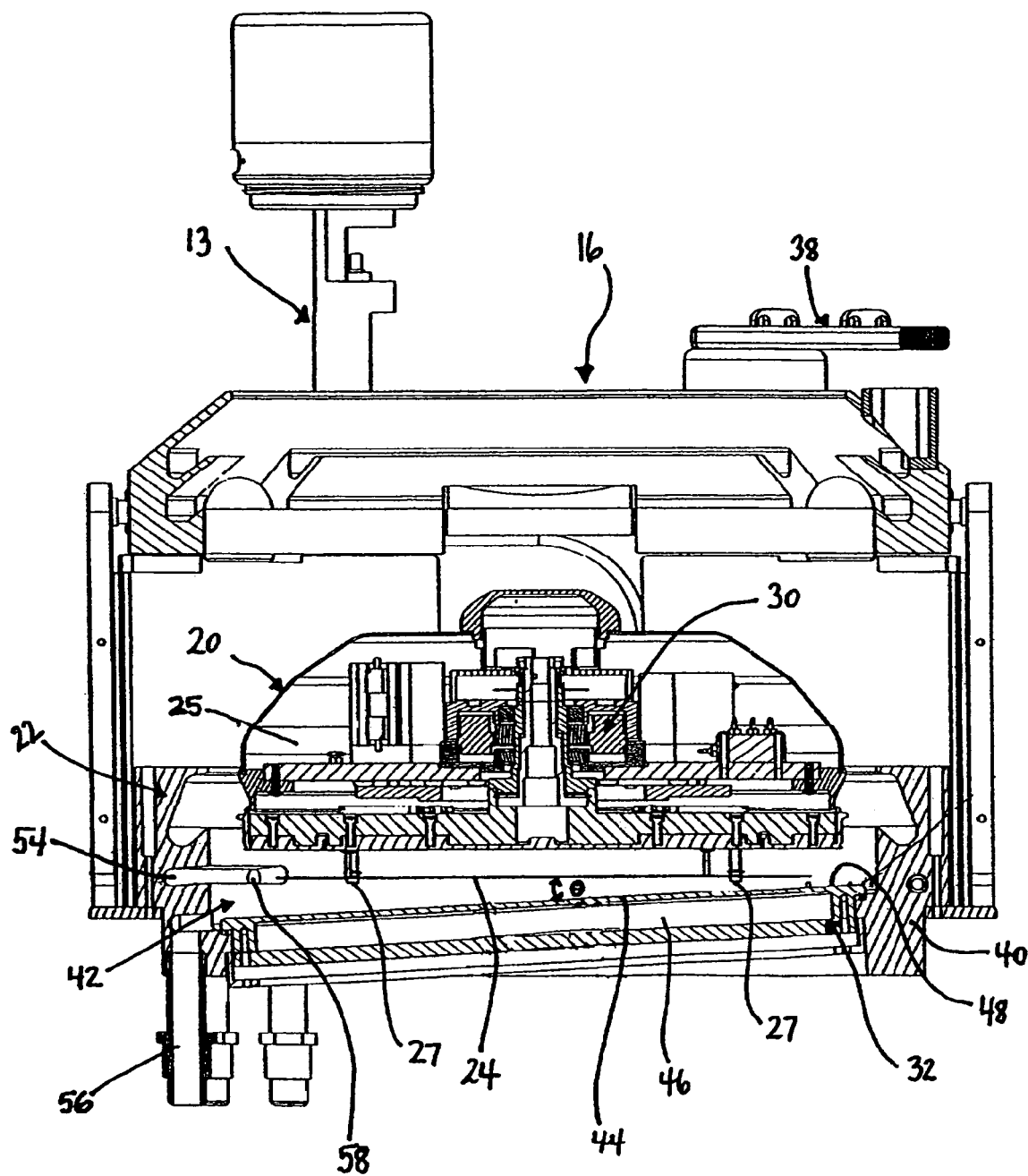
FIG. 7 is a cross-sectional view of the sonic energy process chamber shown in FIG. 3 with the process head in one position according to an embodiment of the present invention.
Figure 8:
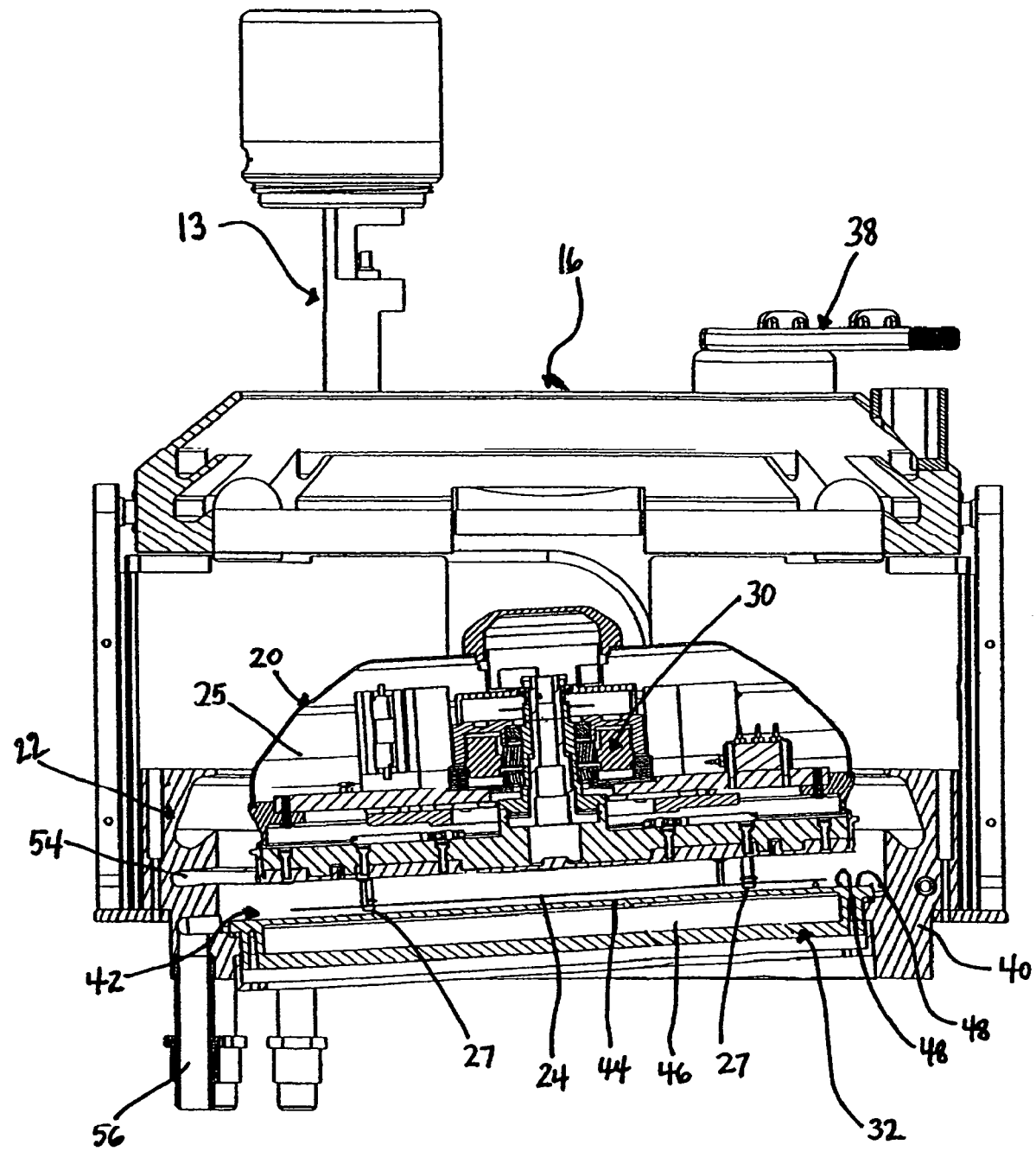
FIG. 8 is a cross-sectional view of the sonic energy process chamber shown in FIG. 3 with the process head in a second position according to an embodiment of the present invention.

Turning now to FIGS. 7 and 8, through much research, it has been determined that by positioning the workpiece 24 at an angle, θ, greater than 0°, a path away from the workpiece 24 is provided for dissipating the sonic energy introduced into the bowl 42. This reduces interference and any dampening effect that may be created by the sonic energy reverberating off the workpiece 24. As a result, the overall efficiency of the treatment process is greatly enhanced. Moreover, an angled sonic energy source 32 improves fluid flow distribution across the workpiece surface and improves the ability to quickly and adequately drain fluid from the process chamber. In a preferred embodiment, the angle, θ, between the sonic energy source 32 and the workpiece 24 is between about 1° and 10°, and even more preferably between about 1° and 5°.

The angle, θ, between the sonic energy source 32 and the workpiece 24 can be formed in a number of different ways. As shown in FIGS. 7 and 8, the sonic energy source 32 can be fixed within the bottom of the bowl 42 at an angle, θ, from a horizontal plane within the bowl 42. Preferably, the angle, θ, is between about 1° and 10° from the horizontal plane, and especially is between about 1° and 5° from the horizontal plane. Optionally, the process head 20 may hold the workpiece 24 in a substantially horizontal plane, as shown in FIG. 7, creating an angle, θ, between the workpiece 24 and the sonic energy source 32, or the process head 20 may be rotated by lift/rotate actuator 13, as shown in FIG. 8, so that the workpiece 24 is substantially parallel to the sonic energy source 32. Alternatively, the sonic energy source 32 may be fixed in a substantially horizontal plane within the bowl 42, with the rotating process head 20 optionally holding the workpiece 24 at an angle, or substantially parallel, to the sonic energy source 32.

Figure 11:
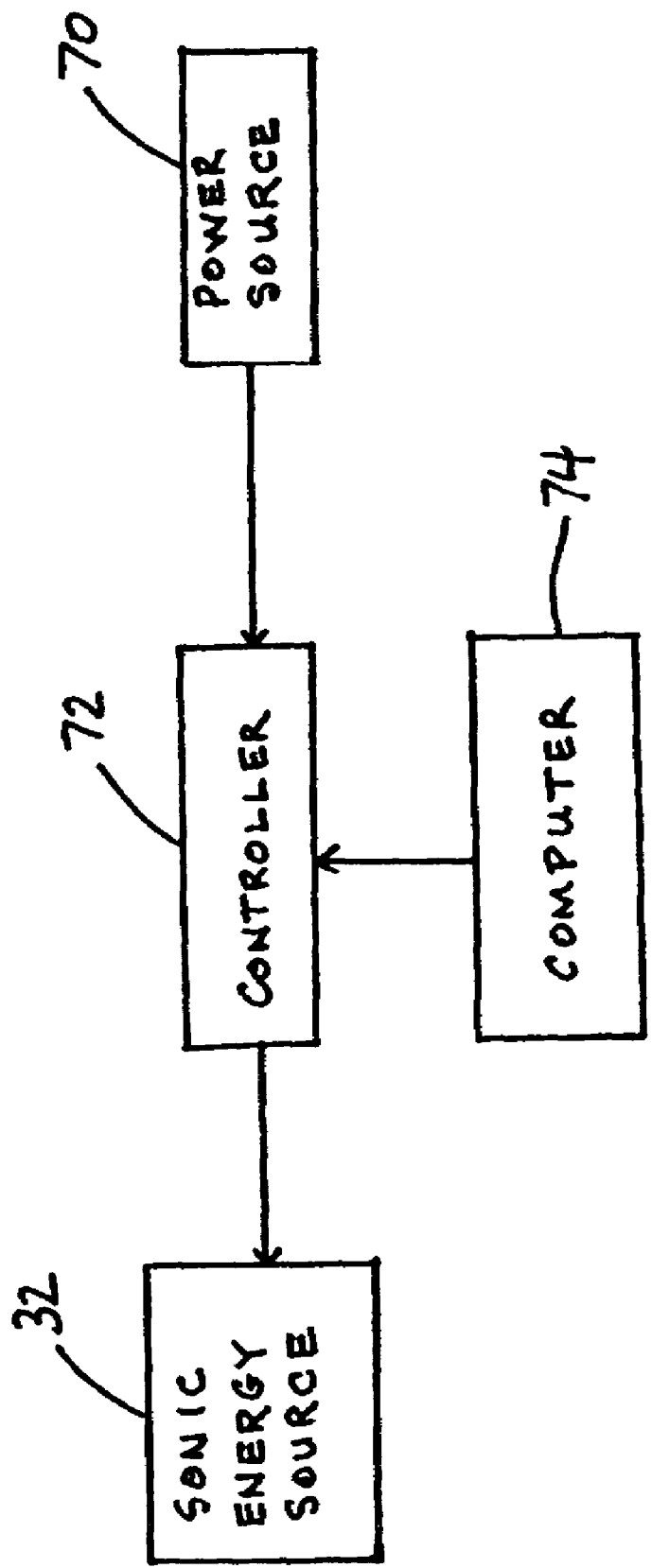
FIG. 11 is a schematic diagram of a method for treating a workpiece with sonic energy in accordance with an embodiment of the present invention.

Referring to FIG. 11, in order to prevent the sonic energy from destroying or damaging the wafer 24 and microelectronics formed on the surface thereof, in a preferred embodiment, the power source 70 supplying power to the sonic energy source 32 is controlled by controller 72 and monitored by computer 74.

The present invention allows for more efficient and productive use of sonic energy in a semiconductor wafer processing environment by any one of the following (alone or in combination): (1) controlling the sonic energy delivered to the process chamber; (2) utilizing a sonic energy source with a total working surface area equal to or greater (or even between about 25% and 100% of the wafer surface being treated); and (3) providing an angle between the sonic energy source and the wafer in the process chamber.

While the process head, rotors, workpieces and other components are described as having diameters, they can also have non-round shapes.

While embodiments and applications of the present invention have been shown and described, it will be apparent to one skilled in the art that other modifications are possible without departing from the inventive concepts herein. The invention, therefore, is not to be restricted except by the following claims and their equivalents.

We claim:

1. A single workpiece processor, comprising:
a bowl for holding a liquid, with the depth of the bowl less than a diameter of the bowl;
a sonic energy source associated with the bowl for introducing sonic energy into the liquid in the bowl;
a process head including a rotor for holding and rotating a single workpiece, and with the process head moveable to lower the workpiece into the liquid in the bowl to form an angle, θ, between the sonic energy source and the workpiece, the angle, θ, being greater than 0° with the rotor adapted to rotate the workpiece about an axis substantially perpendicular to the workpiece, and substantially aligned with a center of the workpiece.

2. The single workpiece processor of claim 1, wherein the sonic energy source comprises a substantially horizontal surface in the bowl, and the rotor is adapted for holding the workpiece at an angle θ of from about 1° to about 10° relative to the substantially horizontal surface.

3. The workpiece processor of claim 1, wherein the angle, 0, is between about 1° and about 5°.

4. The workpiece processor of claim 1, wherein the sonic energy source is fixed within the bowl and the process head is designed to tilt the workpiece from a first position to a second position relative to the sonic energy source.

5. The workpiece processor of claim 4, wherein in the first position the workpiece is approximately parallel to the sonic energy source and in the second Position the workpiece is at an angle relative to the sonic energy source.

6. The workpiece processor of claim 1, wherein the sonic energy source is fixed within the bowl at an angle from about 1° to about 10° from a horizontal plane, and with the sonic energy source substantially at the bottom of the bowl, and with the rotor adapted to hold the workpiece in a substantially horizontal orientation.

7. The workpiece processor of claim 1 further comprising an inlet port in the bowl and a drain port in the bowl substantially opposite from the inlet port.

8. The workpiece processor of claim 1 further comprising a fluid level sensor in the bowl.

9. The workpiece processor of claim 1 wherein the process head is moveable to position a workpiece in the head into a first processing position in the bowl and into a second processing position in the bowl.

10. The workpiece processor of claim 1 further comprising a motor linked to the process head.

11. The system of claim 1 wherein the sonic energy source is fixed in a position approximately parallel to a horizontal plane in the bowl.

12. The system of claim 1 wherein the sonic energy source is in a fixed position forming an angle with a horizontal plane in the bowl.

13. The system of claim 1 wherein the process head is adapted to hold a substantially round workpiece having a diameter D, and wherein the sonic energy source is substantially round.

14. The system of claim 1 further comprising means for monitoring and controlling the sonic energy source.

15. A system for processing workpieces, comprising:
a plurality of workpiece stations, with at least one station comprising:
a bowl for holding a liquid;
a substantially flat sonic energy plate in the bowl for introducing sonic energy into liquid in the bowl;
a process head having a single workpiece holder, with the process head movable to position the workpiece holder into the bowl with the workpiece holder at an angle, of about 1-10° relative to the sonic energy plate: and
a robot moveable between the workpiece stations for moving a workpiece from one station to another station.

16. A workpiece processor, comprising:
a bowl;
at least one liquid inlet and one liquid outlet in the bowl;
a sonic energy source forming at least part of a bottom surface of the bowl;
a process head including a rotor adapted to hold and rotate a workpiece;
a process head lifter attached to the process head for moving the process head vertically into and out of engagement with the bowl and for pivoting the process head between load and process positions;
and with a plane of rotation of the rotor and the sonic energy source forming an acute angle between them.

17. The workpiece processor of claim 16 with the sonic energy source having a substantially flat top surface aligned at an angle to horizontal.

18. The workpiece processor of claim 16 further comprising a liquid in the bowl, and with the sonic energy source aligned in a plane forming an angle with a top surface of the liquid.

19. The workpiece processor of claim 16 with the angle ranging from 1 to 10°.

20. The workpiece processor of claim 16 with the process head moveable into the bowl to position a workpiece in the head adjacent to the sonic energy source.

21. The workpiece processor of claim 16, wherein the bowl has a diameter greater than the depth of the bowl.

22. The workpiece processor of claim 16 further comprising a controller linked to a power source supplying power to the sonic energy source, and a computer linked to the controller.

23. A workpiece processor, comprising:
a bowl for holding a liquid;
a sonic energy source associated with the bowl for introducing sonic energy into the liquid in the bowl;
a process head for holding the workpiece and lowering the workpiece into the liquid in the bowl to form an angle, θ, between the sonic energy source and the workpiece, the angle, θ, being greater than 0°, and with the process head including an upper rotor engageable with a lower rotor.

24. A workpiece processor, comprising:
a bowl for holding a liquid;
a sonic energy source associated with the bowl for introducing sonic energy into the liquid in the bowl;
a process head for holding the workpiece and lowering the workpiece into the liquid in the bowl to form an angle, θ, between the sonic energy source and the workpiece, the angle, θ, being greater than 0°, and
with the process head adapted to hold a substantially round workpiece having a diameter D, and with the sonic energy source having a diameter of at least 75% of D.

* * * * *